United States Patent
Bergendahl et al.

(10) Patent No.: US 10,546,813 B2
(45) Date of Patent: Jan. 28, 2020

(54) BEOL VERTICAL FUSE FORMED OVER AIR GAP

(71) Applicant: INTERNATIONAL BUSINESS MACHINES CORPORATION, Armonk, NY (US)

(72) Inventors: Marc A. Bergendahl, Troy, NY (US); James J. Demarest, Rensselaer, NY (US); Christopher J. Penny, Saratoga Springs, NY (US); Christopher J. Waskiewicz, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/956,355

(22) Filed: Apr. 18, 2018

(65) Prior Publication Data
US 2018/0240752 A1    Aug. 23, 2018

Related U.S. Application Data

(62) Division of application No. 15/358,701, filed on Nov. 22, 2016, now Pat. No. 9,997,454, which is a division
(Continued)

(51) Int. Cl.
*H01L 21/00*    (2006.01)
*H01L 23/525*    (2006.01)
(Continued)

(52) U.S. Cl.
CPC .... *H01L 23/5256* (2013.01); *H01L 21/76802* (2013.01); *H01L 21/76834* (2013.01);
(Continued)

(58) Field of Classification Search
CPC ............. H01L 23/5256; H01L 23/5329; H01L 21/7682
See application file for complete search history.

(56) References Cited

U.S. PATENT DOCUMENTS 6,218,279 B1    4/2001    Weber et al.
6,633,055 B2 *  10/2003   Bertin ............... H01L 23/5256
                                                          257/173
(Continued)

OTHER PUBLICATIONS

Rizzolo, R.F. et al., "IBM System z9 eFUSE applications and methodology" IBM J. Res. & Dev. (Jan./Mar. 2007) pp. 65-75, vol. 51, No. 1/2.
(Continued)

*Primary Examiner* — Laura M Menz
(74) *Attorney, Agent, or Firm* — Tutunjian & Bitetto, P.C.; Vazken Alexanian

(57) ABSTRACT

A method of forming an electrical device that includes forming a first level including an array of metal lines, wherein an air gap is positioned between the adjacent metal lines. A second level is formed including at least one dielectric layer atop the first level. A plurality of trench structures is formed in the at least on dielectric layer. At least one of the plurality of trench structures opens the air gap. A conductive material is formed within the trenches. The conductive material deposited in the open air gap provides a vertical fuse.

20 Claims, 4 Drawing Sheets

Related U.S. Application Data of application No. 15/050,975, filed on Feb. 23, 2016, now Pat. No. 9,666,528.

(51) Int. Cl.
| | |
|---|---|
| *H01L 23/532* | (2006.01) |
| *H01L 21/768* | (2006.01) |
| *H01L 23/522* | (2006.01) |
| *H01L 23/528* | (2006.01) |

(52) U.S. Cl.
CPC ...... *H01L 21/76837* (2013.01); *H01L 23/528* (2013.01); *H01L 23/5226* (2013.01); *H01L 23/5329* (2013.01); *H01L 23/53295* (2013.01); *H01L 21/7682* (2013.01)

(56) References Cited

U.S. PATENT DOCUMENTS

| | | | |
|---|---|---|---|
| 7,892,926 B2* | 2/2011 | Barth | H01L 23/5256 257/E21.592 |
| 8,089,105 B2* | 1/2012 | Barth | H01L 23/5256 257/209 |
| 8,232,190 B2 | 7/2012 | Bernstein et al. | |
| 8,236,655 B2* | 8/2012 | Barth | H01L 23/5256 257/E21.592 |
| 8,299,567 B2 | 10/2012 | Wang et al. | |
| 8,633,707 B2 | 1/2014 | Filippi et al. | |
| 8,673,765 B2 | 3/2014 | Wang et al. | |
| 8,841,711 B1 | 9/2014 | Cai et al. | |
| 8,962,467 B2 | 2/2015 | Bonnilla et al. | |
| 9,059,170 B2 | 6/2015 | Bao et al. | |
| 9,087,842 B2 | 7/2015 | Choi et al. | |
| 9,153,498 B2 | 10/2015 | Xie et al. | |
| 9,666,528 B1* | 5/2017 | Bergendahl | H01L 23/5256 |
| 2008/0157269 A1* | 7/2008 | Wong | H01L 23/5252 257/529 |
| 2008/0237868 A1* | 10/2008 | Clevenger | H01L 21/76808 257/758 |
| 2009/0090993 A1* | 4/2009 | Henson | H01L 23/5256 257/529 |
| 2009/0091038 A1 | 4/2009 | Chen et al. | |
| 2009/0263951 A1* | 10/2009 | Shibata | H01L 21/76816 438/422 |
| 2011/0018091 A1* | 1/2011 | Barth | H01L 23/5256 257/529 |
| 2011/0042779 A1* | 2/2011 | Barth | H01L 23/5256 257/506 |
| 2011/0045644 A1* | 2/2011 | Barth | H01L 23/5256 438/132 |
| 2011/0140235 A1* | 6/2011 | Oda | H01L 23/5256 257/529 |
| 2013/0176073 A1 | 7/2013 | Bao et al. | |
| 2013/0214894 A1* | 8/2013 | Bonilla | H01H 69/02 337/290 |
| 2014/0264479 A1 | 9/2014 | Cai et al. | |
| 2015/0021683 A1 | 1/2015 | Xie et al. | |
| 2015/0228582 A1* | 8/2015 | Sel | H01L 21/7682 257/751 |
| 2015/0263160 A1 | 9/2015 | Xie et al. | |
| 2015/0311151 A1* | 10/2015 | Chi | H01L 23/528 257/773 |
| 2016/0020168 A1* | 1/2016 | Kao | H01L 23/528 257/774 |
| 2016/0020176 A1* | 1/2016 | Yang | H01L 23/53228 257/759 |
| 2016/0064345 A1* | 3/2016 | Shimoda | H01L 27/11519 257/773 |
| 2016/0111326 A1* | 4/2016 | Ohori | H01L 21/76843 438/653 |
| 2016/0126130 A1* | 5/2016 | Takahashi | H01L 21/7682 257/774 |
| 2016/0126179 A1* | 5/2016 | Takahashi | H01L 21/76829 257/774 |
| 2016/0204059 A1* | 7/2016 | Fukuo | H01L 21/76802 257/751 |
| 2017/0229395 A1* | 8/2017 | Kim | H01L 23/5329 |
| 2017/0243821 A1* | 8/2017 | Bergendahl | H01L 23/5256 |
| 2017/0243822 A1* | 8/2017 | Bergendahl | H01L 23/5256 |

OTHER PUBLICATIONS

U.S. Office Action issued in related U.S. Appl. No. 15/479,922, dated Jan. 12, 2018, pp. 1-13.
U.S. Office Action issued in U.S. Appl. No. 16/053,282 dated Jun. 17, 2019, 10 pages.
List of IBM Patents or Patent Applications Treated as Related dated Apr. 18, 2018, 2 pages.

* cited by examiner

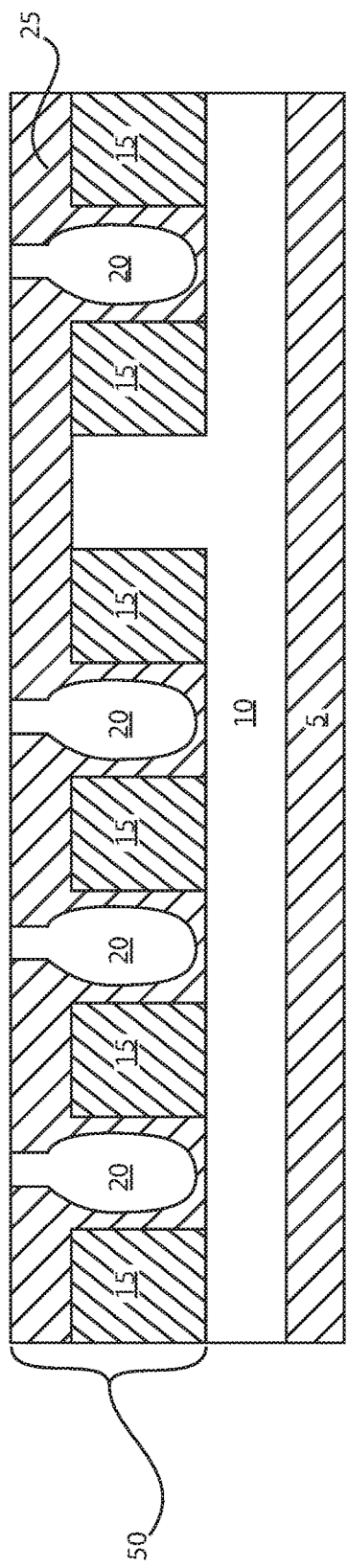
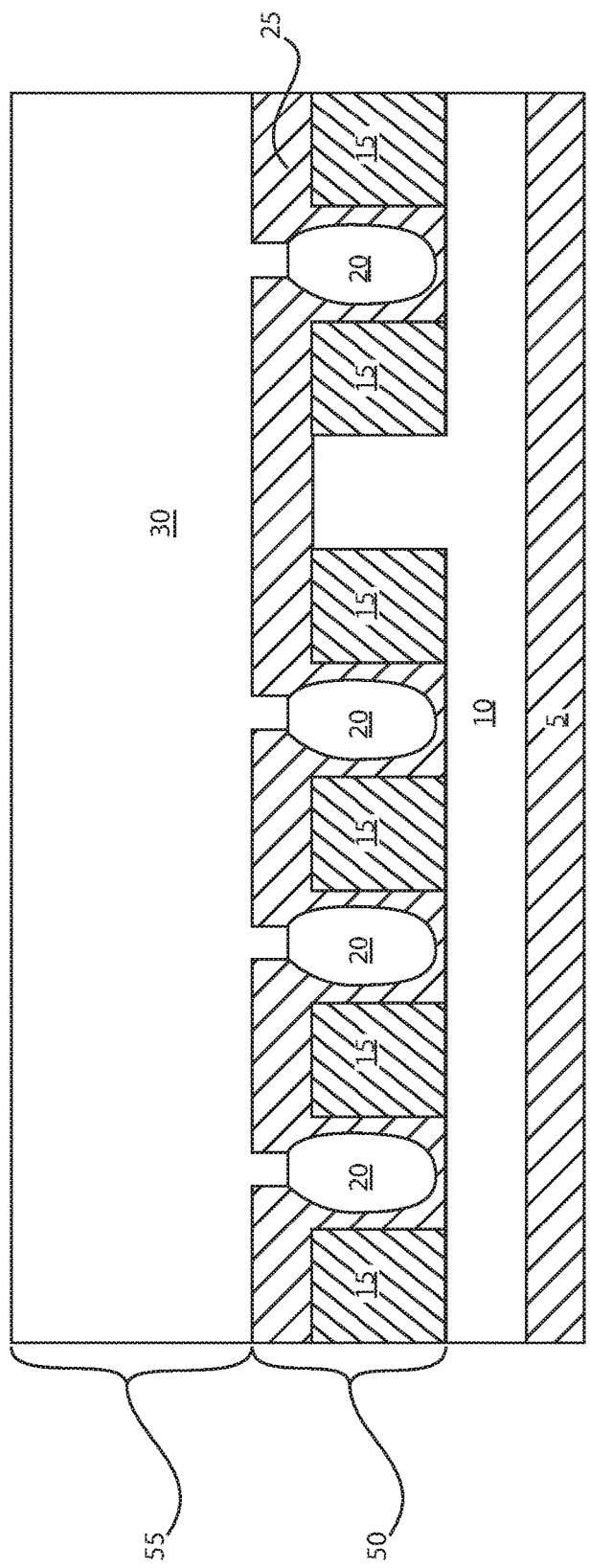

BEOL VERTICAL FUSE FORMED OVER AIR GAP

BACKGROUND

Technical Field

The present invention relates to electrical devices, and more particularly, to electrical fuses.

Description of the Related Art

During the development of semiconductor technology, fuses have been incorporated in integrated circuits (ICs) to permit design flexibility and to improve yield. For example, fuses can be employed to selectively de-activate portions of a generic integrated circuit (IC) and thereby tailor the circuit to suit particular design needs. Further, fuses can also be utilized in an IC fabricated with redundant elements to permit the isolation and replacement of defective components of the circuit.

SUMMARY

The present disclosure is directed to an electrical device and methods of forming an electrical device including air gap structures. In some embodiments, the methods disclosed herein provide a prior-level air gap that is merged with a line and/or via to create a vertical fuse. In one embodiment, the method includes forming an array of metal lines. A dielectric cap is conformally deposited atop and within the space separating adjacent metal lines within the array, wherein a thickness of the conformally deposited dielectric cap pinches off within the space separating said adjacent metal lines to substantially enclose a plurality of air gaps. At least one interlevel dielectric layer may then be deposited overlying a level including said air gaps and said array of metal lines, wherein the interlevel dielectric layer entirely encapsulates the plurality of air gaps. A plurality of trenches is then formed in the interlevel dielectric, wherein at least one trench opens at least one of the pluralities of air gaps. A vertical fuse is then formed in the opened air gap, the vertical fuse being present in said space between adjacent metal lines.

In another embodiment, the method may include forming a first level of an electrical device including an array of metal lines, wherein at least one set of adjacent metal lines in said array of metal lines includes an air gap positioned therebetween. A second level including at least one dielectric layer is formed atop the first level. A plurality of trench structures is formed in the at least one dielectric layer, wherein at least one of the plurality of trench structures opens the air gap, and at least one of the plurality of trench structures is to a depth that does not communicate with the air gap. A conductive material is formed within the trenches, wherein the conductive material deposited in the open air gap provides a vertical fuse, and the portion of the conductive material formed in the plurality of trench structures that do not communicate with the air gap provide interconnect structures.

In another aspect of the present disclosure, an electrical device is provided including a first level comprised of an array of metal lines, wherein a plurality of air gaps are present separating adjacent metal layers in the array of metal lines and one of the air gaps includes a fuse structure present therein. A second level includes a plurality of trenches in an interlevel dielectric layer that contain electrically conductive material. A first set of trenches includes electrically conductive material that extends into the air gaps to provide a fuse structure. A second set of trenches containing the electrically conductive material does not extend to the first level and provides interconnect structures.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 2 is a side cross-sectional view of a first level of an electrical device being formed that includes an array of metal lines, and a dielectric cap layer present atop and within the space separating adjacent metal lines within the array that substantially enclose a plurality of air gaps between the metal lines, in accordance with one embodiment of the present disclosure.

FIG. 3 is a side cross-sectional view depicting forming at least one interlevel dielectric layer overlying the level including the air gaps and the array of metal lines, wherein the interlevel dielectric layer entirely encapsulates the plurality of air gaps, in accordance with one embodiment of the present disclosure.

DETAILED DESCRIPTION OF PREFERRED EMBODIMENTS

Figure 1A:
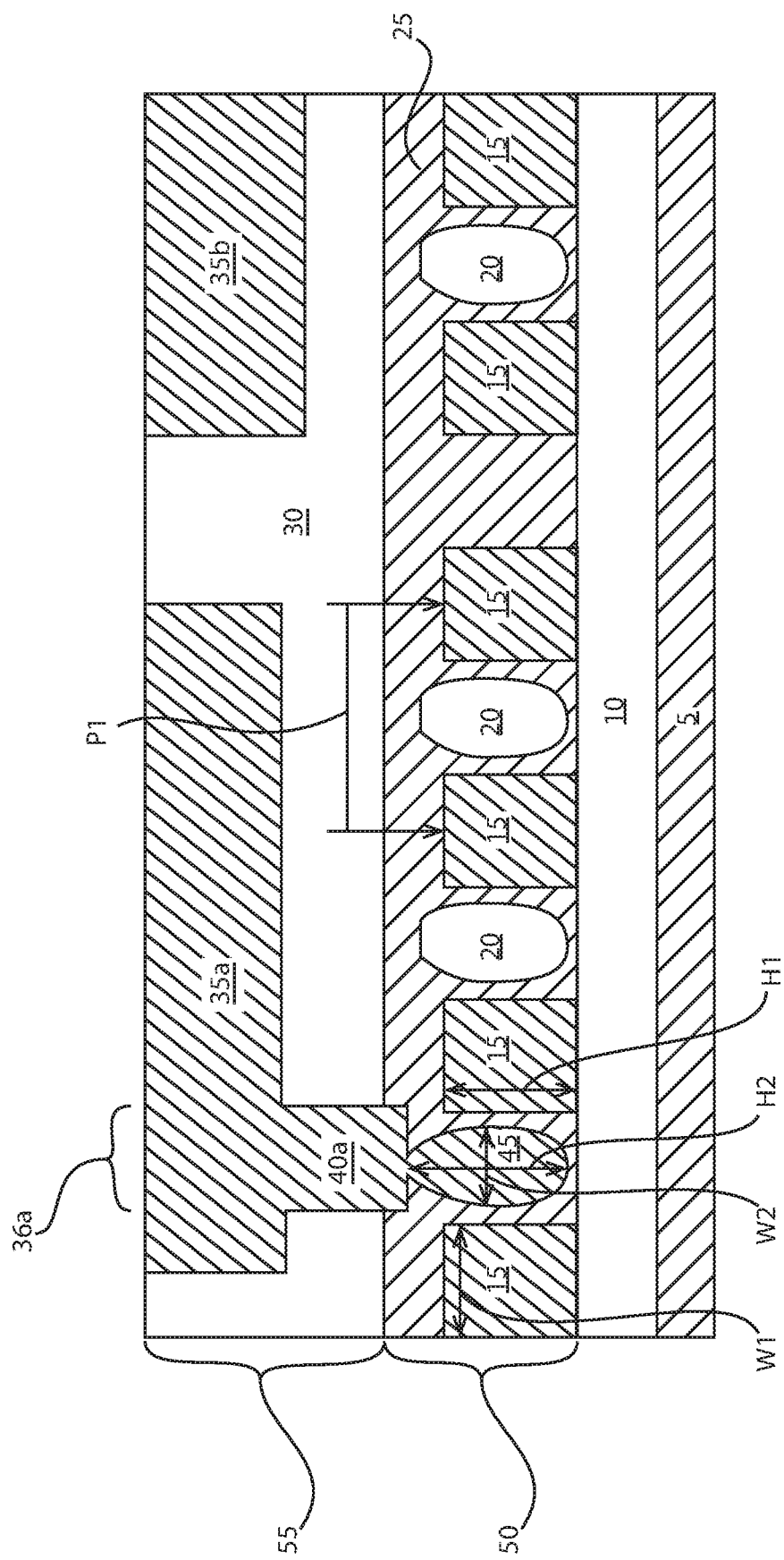
FIG. 1A is a side cross-sectional view depicting one embodiment of a vertical fuse formed over an air gap during back end of the line (BEOL) processing depicting a first contact to the vertical fuse, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide fuses integrated into a level of an electrical device including metal lines and air gaps. A fuse is normally closed or has a relatively lower resistance to allow electric current flowing there through, and when blown or programmed, it becomes open or has an increased resistance. In some embodiments, the fuse may be electrically programmable by using a programming current or voltage that is higher than the circuit's normal operating current or voltage to break down an insulator, or dielectric, thus to permanently change the electrical characteristics once the fuse is "blown" as compared to an unprogrammed fuse. In some examples, a fuse device may include a first contact region and a second contact region that are electrically coupled together by a fuse link region. When a sufficiently large programming current is passed through the fuse region, the fuse region can separate. In this event, the fuse region is completely opened and no longer allows flow of electric current there through.

In some embodiments, the methods and structures disclosed herein provide that airgap structures in a first level of an electrical device are merged with a line and/or via in a second level of the electrical device to create a vertical fuse. In this configuration, a selective application of high current can be used to trigger the fuse. The fuses that are disclosed herein can be blown at very low currents. As will be described herein, the fuses of the present disclosure in some embodiments may be blown using currents ranging from 10 mA to 15 mA. The formation of the efuse within the line level including the air gaps can be achieved without the need for an additional patterning level or added process steps. In a "sea-of-lines" fill scenario, the unused fill regions can be utilized for these fuses, potentially reducing the area required. The methods and structures of the present disclosure are now discussed with more detail referring to FIGS. 1A-4.

Figure 1B:
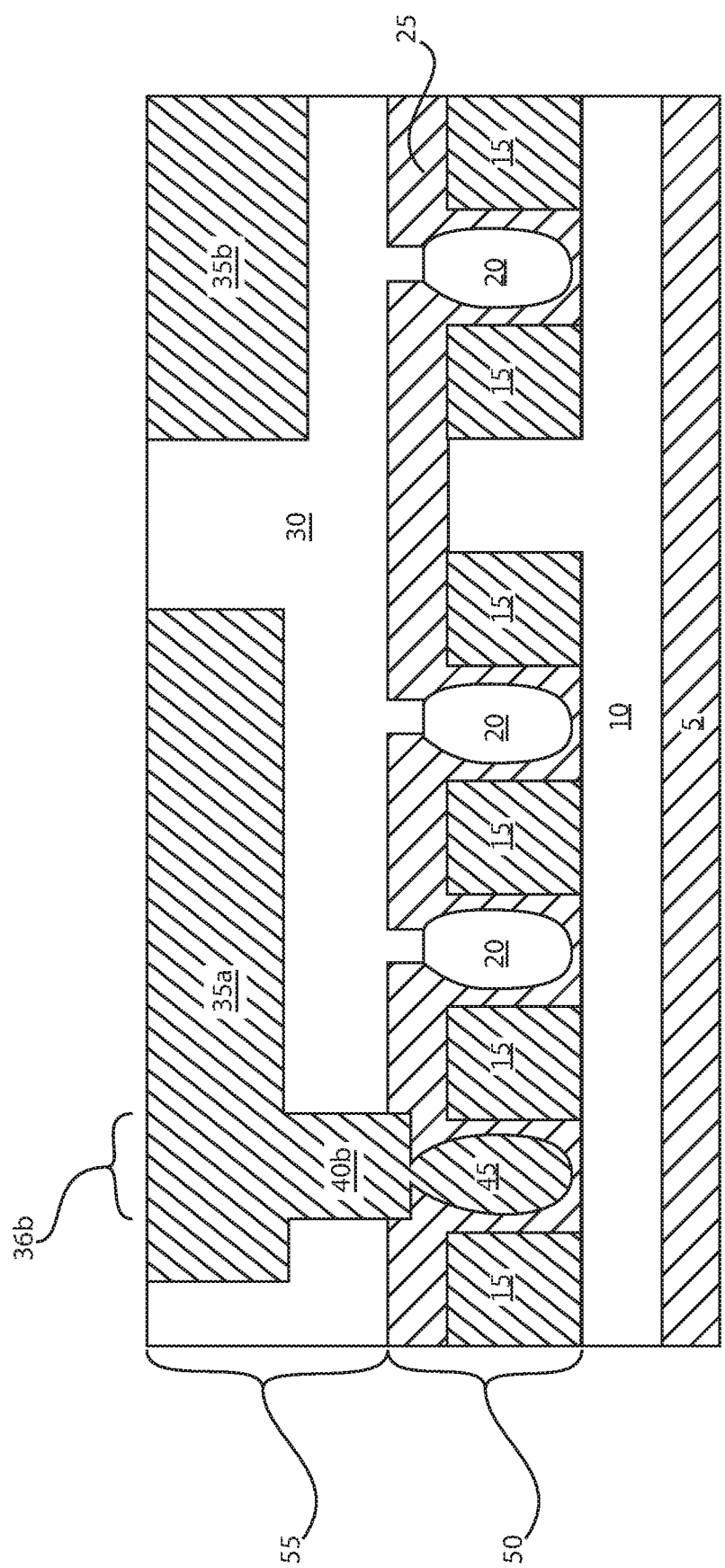
FIG. 1B is a side cross-sectional view of the structure depicted in FIG. 1A along another section line that depicts the second contact to the vertical fuse, in accordance with the present disclosure.

FIGS. 1A and 1B depict one embodiment of a vertical fuse 40a, 40b, 45 formed over an air gap 20 during back end of the line (BEOL) processing. The electrical device 100 may include a plurality of semiconductor devices and memory devices on a semiconductor substrate 5. The substrate 5 may include a semiconductor wafer, such as a type IV semiconductor wafer, e.g., silicon wafer, or a type III-V semiconductor wafer, such as a compound semiconductor, e.g., gallium arsenide semiconductor wafer. In one embodiment, a number of dielectric layers and semiconductor material layers can be arranged with the semiconductor substrate 5 to provide microelectronic devices, or smaller devices, which can include semiconductor devices, such as field effect transistors (FETs), fin type field effect transistors (FinFETs), bipolar junction transistors (BJT) and combinations thereof. The at least one device layer may also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

An intralevel dielectric layer 10 may be present atop the substrate 5. The intralevel dielectric layer 10 may include vias (not shown) and other electrical communication structures (not shown) for bringing electrical signals to and from the devices, e.g., semiconductor devices, memory devices, and passive devices, that are present on the substrate 5 to the metal lines, interconnects and vias that are present in the upper levels. The intralevel dielectric layer 10 may be composed of a low-k dielectric material. The term "low-k" denotes a material having a dielectric constant that is less than the dielectric constant of silicon dioxide ($SiO_2$). For example, a low-k dielectric material for the intralevel dielectric layer 10 may have a dielectric constant that is less than 4.0, e.g., 3.9. In one embodiment, the low-k dielectric material may have a dielectric constant ranging from 1.75 to 3.5. In another embodiment, the intralevel dielectric layer 10 may have a dielectric constant ranging from 2.0 to 3.2. In yet an even further embodiment, the intralevel dielectric layer 10 may have a dielectric constant ranging from 2.25 to 3.0. Examples of materials suitable for the intralevel dielectric layer 10 may include organosilicate glass (OSG), fluorine doped silicon dioxide, carbon doped silicon dioxide, porous silicon dioxide, porous carbon doped silicon dioxide, spin-on organic polymeric dielectrics (e.g., SILK.™), spin-on silicone based polymeric dielectric (e.g., hydrogen silsesquioxane (HSQ) and methylsilsesquioxane (MSQ), and combinations thereof.

The vias (not shown) and other electrical communication structures (not shown) that are present in the intralevel dielectric layer 10 for bringing electrical signals to and from the devices, e.g., semiconductor devices, memory devices, and passive devices, that are present on the substrate 5 may be composed of an electrically conductive material such as a metal, e.g., copper, tungsten, platinum, silver, aluminum or alloys thereof, or a conductive semiconductor, such as n-type doped polysilicon.

Still referring to FIGS. 1A and 1B, a first level 50 is present atop the intralevel dielectric layer 10 that includes an array of metal lines 15, and a plurality of air gaps 20 are present separating adjacent metal lines 15 in the array of metal lines and one of the air gaps includes a fuse structure 45 present therein. The metal lines 15 may be arranged in an array configuration, in which the length of the adjacent metal lines 15 runs substantially parrallel to one another. The metal lines 15 can provide electrical communication horizontally across the electrical device from one region of the electrical device to another, and can also be in communication with vias that bring the electrical signals to the interconnects and related structures in the low-k intralevel dielectric layer 10 and the substrate 5.

The metal lines 15 may be composed of any electrically conductive material. For example, the metal lines 15 may be composed of copper, silver, platinum, aluminum, gold, tungsten and combinations thereof. In other embodiments, the metal lines may be composed of an n-type semiconductor material, such as n-type polysilicon. The metal lines 15 may have a height H1 ranging from 20 nm to 1000 nm, and a width W1 ranging from 5 nm to 500 nm. In another embodiment, the metal lines 15 may have a height H1 ranging from 20 nm to 100 nm, and a width W1 ranging from 10 nm to 80 nm. The pitch P1 separating the adjacent metal lines may range from 20 nm to 1000 nm. In another embodiment, the pitch P1 may range from 30 nm to 80 nm. In yet another embodiment, the pitch P1 may range from 40 nm to 50 nm.

A dielectric cap layer 25 that is substantially conformal is present on the sidewall and upper surface of the metal lines 15 and is present within the space separating adjacent metal lines 15 atop the intralevel dielectric 10. The dielectric cap layer 25 does not fill the space between the adjacent metal lines 15. In some embodiments, the thickness of the substantially conformal dielectric cap layer 25 pinches off the space separating the adjacent metal lines 15 to substantially enclose a plurality of air gaps 20. It is noted that the dielectric cap layer 25 may not entirely close off the air gap. For example, in the embodiment that is depicted in FIGS. 1A and 1B, the opening to the air gaps 20 may have a width ranging from 5 nm to 40 nm.

FIGS. 1A and 1B further depict a second level 55 of the electrical device that includes a plurality of trenches 60, 65 in an interlevel dielectric layer 30 that contains electrically conductive material. The electrically conductive material provides communication structures, e.g., lines and vias, for transmitting electrical signals horizontally and vertically through the electric device. In some embodiments, the first set of trenches 60 includes electrically conductive material that extends into at least one of the air gaps 20 in the first level 50 to provide the fuse link 45 of a fuse 40a, 40b, 45. A second set of trenches 65 containing the electrically conductive material does not extend to the first level 50 and provides interconnect structures.

The trenches 60, 65 in the second level 55 are formed in an interlevel dielectric layer 30. The interlevel dielectric layer 30 may be composed of any dielectric material. Examples of dielectric materials that may be used for the interlevel dielectric layer 30 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable.

The interlevel dielectric layer 30 is present directly atop the dielectric cap layer 25 of the first level 50. The interlevel dielectric layer 30 entirely closes off the opening to a majority of the air gaps 20 that are present in the first level.

The trenches 60, 65 are typically formed in patterned and etched portions of the interlevel dielectric. The first trench 60 may include line portions 35a, and via portions 36a, 36b. The line portion 35a typically extends horizontally in and out of the page, and can carry electrical signal horizontally throughout the electrical device. The via portions 36a, 36b typically extend vertically, i.e., from top to bottom, through the electrical device. In the embodiment that is depicted in FIGS. 1A and 1B, the first via portion 36a that is depicted in FIG. 1A provides an opening for housing a first contact region 40a to the fuse link 45 of the fuse, and the second via portion 36b that is depicted in FIG. 1B provides an opening for housing a second contact region 40b. FIG. 1A is a separate cross section from FIG. 1B. The fuse link 45 has a first contact region 40a at a first end of the fuse link 45, and a second contact region 40b at a second end of the fuse link 45. The fuse link 45 extends along a horizontal direction into and out of the page for the structures depicted in FIGS. 1A and 1B. The second trench 65 is free of via openings to fuse links.

The trenches 60, 65 are filled with an electrically conductive material that provides the metal lines, i.e., interconnect structures, in the first trenches 60, and the second trenches 65. The electrically conductive material may be a metal, such as aluminum, copper, silver, tungsten, gold, platinum, titanium, and/or alloys and combinations thereof. In other embodiments, the electrically conductive material may be a doped semiconductor material, such as n-type doped polysilicon. The via portions 36a, 36b that are present in the first trench 60 are also filled with the electrically conductive material to provide the first and second contact regions 40a, 40b of the fuse 40a, 40b, 45. The via portions 36a, 36b may be composed of the same or a different composition of electrically conductive material for forming the first contact region 45a and the second contact region 45b that provides the metal line within the first trench 60. The electrically conductive material from the second level 50 extends into the air gap that houses the vertically orientated fuse link 45. The fuse link 45 that is present in the first level 50 may be composed of the same or a different composition of electrically conductive material as the electrically conductive material that is present in the via portions 36a, 36b of the first trench 60 in the second level 55 that provide the first contact region 45a and the second contact region 45b.

The fuse includes a fuse link 45 having a height H2 ranging from 20 nm to 1000 nm. In other embodiments, the fuse link 45 has a height H2 ranging from 20 nm to 100 nm. As depicted in FIGS. 1A and 1B, the fuse link 45 is contained within an air gap having a curved sidewall. Therefore, the width of the fuse link 45 varies along its depth starting with an increasing width from the top surface of the fuse link 45 to the middle portion of the height of the fuse link 45, which is typically the widest portion of the fuse link 45. In the embodiment depicted in FIGS. 1A and 1B, the width of the fuse link 45 may decrease from the middle portion of the height of the fuse link 45 to the base of the fuse link 45. In some embodiments, the greatest width W2 of the fuse link 45, i.e., the width of the fuse link 45 at its middle portion, ranges from 5 nm to 500 nm. In other embodiments, the greatest width W2 of the fuse link 45, i.e., the width of the fuse link 45 at its middle portion, ranges from 10 nm to 80 nm. The length of the fuse link 45 is the dimension separating the portion of the fuse link 45 that is in contact with the first contact region 40a from the portion of the fuse link 45 that is in contact with the second contact region 40b.

In some embodiments, the fuse 40a, 40b, 45 is configured to blow at low currents, e.g., the fuse 40a, 40b, 45 may be blow at currents ranging from 10 mA to 15 mA. To provide this electrical performance, the width of the neck region opening W3 at the interface of the first and second contact regions 40a, 40b and the fuse link 45 ranges from 5 nm to 200 nm. In another embodiment, the width of the neck region opening W3 at the interface of the first and second contact regions 40a, 40b and the fuse link 45 ranges from 5 nm to 40 nm. It is noted that the above examples, are provided by illustrative purposes only, and are not intended to limit the present disclosure, as other examples have also been contemplated.

The above mentioned structures depicted in FIGS. 1A and 1B, are now described in greater detail with reference to FIGS. 2-4. In another aspect of the present disclosure, a method of forming a vertical fuse is provided, such as the vertical fuses depicted in FIGS. 1A and 1B. In some embodiments, the methods disclosed herein provide a prior-level air gap, i.e., first level 50, that is merged with a line and/or via 35b, 40a, 40b to create a vertical fuse 40a, 40b, 45. In one embodiment, the method includes forming an array of metal lines 15. A dielectric cap 25 is conformally deposited atop and within the space separating adjacent metal lines 15 within the array, wherein a thickness of the conformally deposited dielectric cap 25 pinches off within the space separating said adjacent metal lines 15 to substantially enclose a plurality of air gaps 20. At least one interlevel dielectric layer 30 may then be deposited overlying the first level 50 including the air gaps 20 and said array of metal lines 15, wherein the interlevel dielectric layer 30 entirely encapsulates the plurality of air gaps 20. A plurality of trenches 60, 65 are then formed in the interlevel dielectric, wherein at least one trench opens at least one of the plurality of air gaps. A vertical fuse 40a, 40b, 45 is then formed in the opened air gap, the vertical fuse being present in said space between adjacent metal lines 15. Further details of some embodiments of this method are now described with greater detail while referring to FIGS. 2-4.

FIG. 2 depicts one embodiment of a first level 50 of an electrical device being formed that includes an array of metal lines 15, and a dielectric cap layer 25 present atop and within the space separating adjacent metal lines 15 within the array that substantially enclose a plurality of air gaps 20 between the metal lines 15. The method may begin with forming the intralevel dielectric layer 10 on the semiconductor substrate 5. As noted above, the semiconductor substrate 5 may include a number of semiconductor devices, memory devices, and passive electrical devices. The intralevel dielectric layer 10 may be deposited on the semiconductor substrate 5. The intralevel dielectric layer 10 may be deposited using a chemical vapor deposition (CVD) process. Examples of chemical vapor deposition processes suitable for forming the intralevel dielectric layer 10 may include, but is not limited to, Atmospheric Pressure CVD (APCVD), Low Pressure CVD (LPCVD) and Plasma Enhanced CVD (PECVD), Metal-Organic CVD (MOCVD) and combinations thereof may also be employed. It is noted that forming the intralevel dielectric layer 10 is not limited to only CVD methods. Other examples of deposition methods suitable for forming the intralevel dielectric include dip coating, spin-coating, brush coating, sputtering, chemical solution deposition, physical vapor deposition, and plating.

After depositing the intralevel dielectric layer 10, trenches may be formed for forming the array of metal lines 15. The trenches may be formed using deposition, photolithography and etch processes. For example, a photoresist mask may be formed on the upper surface of the intralevel dielectric layer 10 using deposition and photolithography, in which the openings in the photoresist mask correspond to the portions of the intralevel dielectric layer 10 that are etched to provide the trenches for the array of metal lines 15. More specifically, in one embodiment, a photoresist pattern (also referred to as photoresist mask) is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. The exposed portions of the interlevel dielectric layer 10 may then be etched to provide the trenches for the array of metal lines 15 using the photoresist mask as an etch mask. The etch process for providing the trenches for the array of metal lines 15 may remove the intralevel dielectric layer 10 selectively to the etch mask. The etch process for forming the trenches for the array of metal lines 15 may include an anisotropic etch, such as reactive ion etch, laser etching, plasma etching, or a combination thereof.

Following formation of the trenches for the array of metal lines 15, an electrically conductive material may be deposited in the trenches to form the metal lines 15. In some embodiments, in which the electrically conductive material 15 is composed of a metal, the metal for the electrically conductive material may be deposited in the trenches using plating or physical vapor deposition methods. Examples of plating include electroplating and electroless plating. Physical vapor deposition methods for forming the electrically conductive material 15 may include sputtering. Examples of sputtering apparatus that may be suitable for depositing the metal layer for the array of metal lines 15 include DC diode type systems, radio frequency (RF) sputtering, magnetron sputtering, and ionized metal plasma (IMP) sputtering. In addition to physical vapor deposition (PVD) techniques, the array of metal lines 15 may also be formed using chemical vapor deposition (CVD) and atomic layer deposition (ALD). In the embodiments, in which a conductive semiconductor material is substituted for the metal, the conductive semiconductor material may be deposited using chemical vapor deposition (CVD).

In some embodiments, after depositing the electrically conductive material for the array of metal lines, a planarization process may be applied to the deposited material, so that the upper surface of the electrically conductive material is coplanar with the upper surface of the intralevel dielectric layer 10. The planarization process may be provided by chemical mechanical planarization (CMP).

Still referring to FIG. 2, following formation of the array of metal lines 15, a plurality of air gaps 20 may be formed between adjacent metal lines 15 in the array of metal lines 15. Forming the plurality of air gaps 20 may begin with recessing the portion of the intralevel dielectric layer 10 that is present between adjacent metal lines 15. The intralevel dielectric layer 10 may be recessed by an etch process. In some embodiments, etch masks may be formed blocking portions of the intralevel dielectric layer that are not to be removed by the etch process, and remain between adjacent metal lines. The etch process for recessing the intralevel dielectric layer 10 between the adjacent metal lines may be a dry etch process, such as a plasma etch or reactive ion etch process, or may be a wet chemical etch. The etch process may continue to recess the intralevel dielectric layer 10 that is present between adjacent metal lines 15 until the recessed surface of the intralevel dielectric layer 10 is substantially coplanar with the base surface of the metal lines 15. After recessing the intralevel dielectric layer 10 to provide openings for the air gaps 10, any block mask may be removed.

In a following process step, a dielectric cap layer 25 is conformally deposited atop and within the space separating adjacent metal lines 15 within the array, wherein a thickness of the conformally deposited dielectric cap layer 15 substantially pinches off within the space separating the adjacent metal lines 15 to substantially enclose a plurality of air gaps 20. The dielectric cap layer 25 may be composed of any dielectric layer, such as an oxide, nitride or oxynitride. For example, when the dielectric cap layer 25 is composed of an oxide, the dielectric cap layer 25 may be silicon oxide. In another example, when the dielectric cap layer 25 is a nitride, the dielectric cap layer 25 may be composed of silicon nitride.

The dielectric cap layer 25 is deposited using a substantially conformal deposition process so that the dielectric cap layer 25 is formed on the upper surface of the metal lines 15, as well as the sidewalls of the metal lines 15. The dielectric cap layer 25 is also formed on the upper surfaces of the recessed intralevel dielectric layer 10 between the adjacent metal lines 15, as well as the upper surface of the intralevel dielectric layer 10 that is substantially coplanar with the upper surface of the metal lines 15. The deposition process for forming the dielectric cap layer 25 is substantially conformal. The term "conformal" denotes a layer having a thickness that does not deviate from greater than or less than 30% of an average value for the thickness of the layer. The deposition process selected for forming the dielectric cap layer 25 also forms a necked region at the portions of the dielectric cap layer 25 formed on the upper edges of the metal lines 15, in which the necked region substantially pinches off the air gaps 20, but still leaves an opening leading to the air gaps 20. The dielectric cap layer 25 may be deposited using a chemical vapor deposition process, such as plasma enhanced chemical vapor deposition (PECVD). The thickness of the dielectric cap layer 25 may be selected to range from 2 nm to 20 nm. In some embodiments, the thickness of the dielectric cap layer 25 may range from 5 nm to 15 nm. The opening to the air gaps 20 at this stage of the process flow may range from 5 nm to 40 nm. In some embodiments, the upper surface of the dielectric cap layer 25 provides the upper surface of the first level 50 of the electrical device.

FIG. 3 depicts one embodiment of forming at least one interlevel dielectric layer 30 overlying the level 50 including the air gaps 20 and the array of metal lines 15, wherein the interlevel dielectric layer 30 completes the encapsulation of the plurality of air gaps 20. The composition of the interlevel dielectric layer 30 has been described above with reference to FIGS. 1A and 1B. The deposition process selected for forming the interlevel dielectric layer 30 is selected so that the interlevel dielectric layer 30 bridges the openings to the air gaps 20. The interlevel dielectric layer 30 may be deposited using chemical vapor deposition, deposition from solution or spin on deposition. The interlevel dielectric layer 30 is part of the second level 55 of the electrical device.

Figure 4:
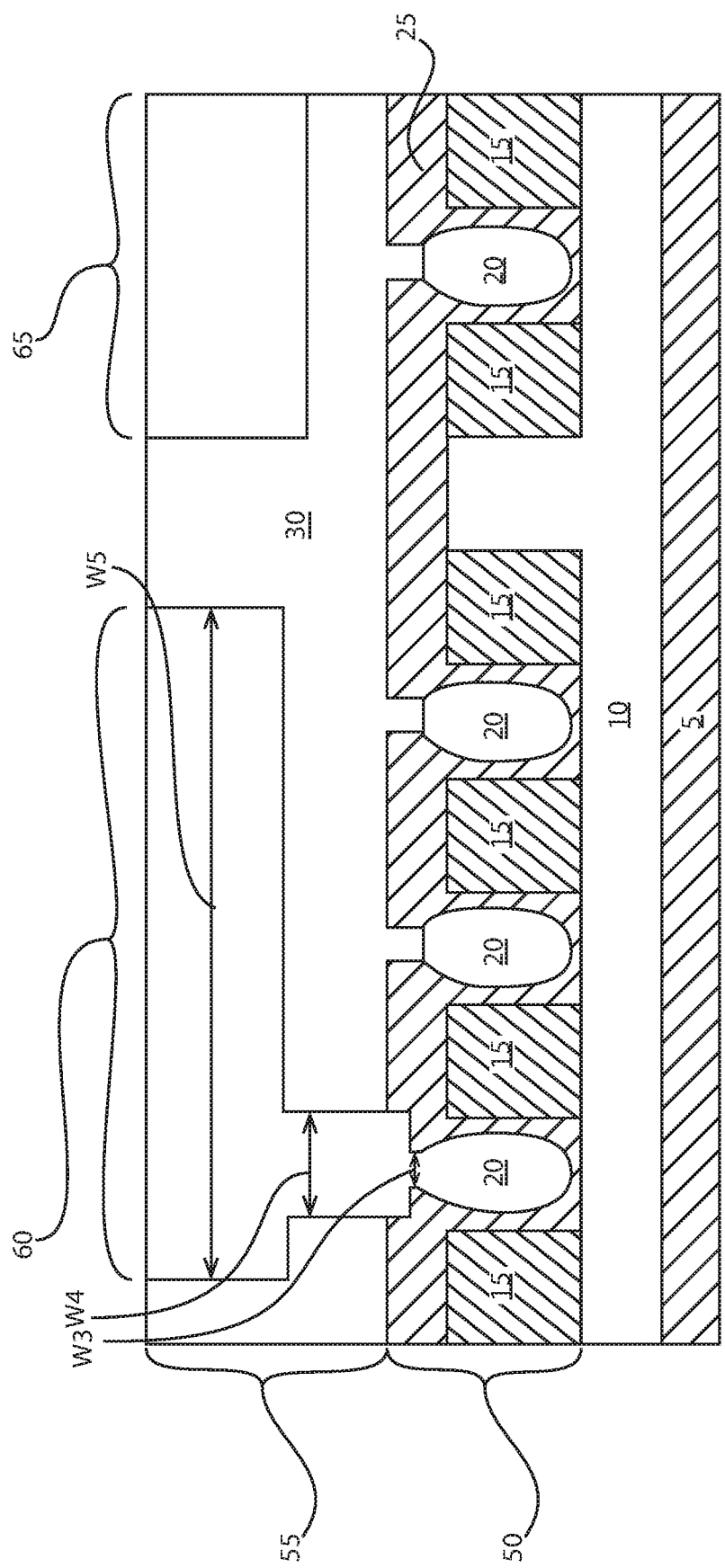
FIG. 4 is a side cross-sectional view depicting forming trenches in the interlevel dielectric, wherein at least one trench opens at least one of the plurality of air gaps, in accordance with one embodiment of the present disclosure.

FIG. 4 depicts one embodiment of forming trenches 60, 65 in the interlevel dielectric layer 30, wherein the at least one trench 60, 65 opens at least one of the plurality of air gaps 20. One set of trenches, e.g., the second trench 65, is provided for interconnect structures that extend horizontally through the electronic device. These trenches do not include a deep trench portion, also referred to as a via, that extends into the first level 50 to open an air gap for forming a fuse 40a, 40b, 45. Another set of trenches, e.g., the first trench 60, includes a first depth that provides for interconnect structures that extend horizontally through the electronic device, and a second depth that extends to the first level 50 and provides an opening to an air gap 20. The portions of the trench having the first depth, i.e., lesser depth, may be referred to as the line portions 35a of the trenches 60, 65. The portions of the trench having the second depth, i.e., greater depth that extends to the first level, may be referred to as the via portions 35b of the trenches 65.

The air gap 20 that is opened is subsequently processed to provide a fuse link 45 of the fuse, and the portions of the trench 60 having the greatest depth, i.e., extending to the first level 50, provide the first contact region 40a and the second contact region 40b of the fuse. In one embodiment, the width of the neck region opening W3 at the interface of the first and second contact regions 40a, 40b and the fuse link 45 ranges from 5 nm to 40 nm.

In one embodiment, the width of the necked region opening W3 is less than one quarter the dimension P1 measuring the pitch of adjacent metal lines in the array of metal lines 15.

The trenches 60, 65 may be formed using photolithography and etch processes similar to the aforementioned method of forming the trenches for the array of metal lines 15, which is described above with reference to FIG. 2. Therefore, the above description for forming the trenches in the intralevel dielectric layer 10 for forming the array of metal lines 15 in the first level 50 of the electrical device, as depicted in FIG. 2, is suitable for describing one embodiment of forming trenches 60, 65 in the interlevel dielectric layer 30 of the second level 55 of the device. The two different depths for the line portions 35a and the via portions 36a, 36b of the trench 60 that leads to the opening to the air gap 20 for housing the fuse may be provided by a method that includes reactive ion etch (RIE) lag; etching using masks for forming vias; and etching using additional masks after forming the vias, e.g., a titanium nitride etch mask for forming deeper openings into the material stack. The via portions 36a, 36b of the trench 60 have a lesser width W4 than the width W5 of the trenches for the metal lines, i.e., interconnects, in the second level 55.

The etch process for forming the via portions 36a of the trench 65 may be selective to the cap dielectric layer 25. This can provide that the portion of the interlevel dielectric layer 30 bridging the opening in the cap dielectric layer 25 overlying the air gap for housing the fuse can be removed without substantially damaging the cap dielectric layer 25. The etch process for removing the portion of the interlevel dielectric layer 30 that is bridging the opening in the dielectric cap layer 25 may be a wet chemical etch, reactive ion etch, gas plasma etch or a combination thereof.

Referring to FIGS. 1A and 1B, following opening of the air gap for housing the fuse link 45, an electrically conductive material is deposited in the trenches 60, 65. The electrically conductive material is typically composed of a metal, but embodiments have been contemplated, in which the electrically conductive material is a doped semiconductor material. In the embodiments, in which the metal for the electrically conductive material may be deposited in the trenches 60, 65, the electrically conductive metal may be deposited using plating or physical vapor deposition methods. Examples of plating include electroplating and electroless plating. Physical vapor deposition methods for forming the metal in the trenches 60, 65 may include sputtering. Examples of sputtering apparatus that may be suitable for depositing the metal layer for the trenches 60, 65 in the second level 55 include DC diode type systems, radio frequency (RF) sputtering, magnetron sputtering, and ionized metal plasma (IMP) sputtering. In addition to physical vapor deposition (PVD) techniques, the electrically conductive material that is formed in the trenches 60, 65 in the second level 55 may also be formed using chemical vapor deposition (CVD) and atomic layer deposition (ALD). In the embodiments, in which a conductive semiconductor material is substituted for the metal, the conductive semiconductor material may be deposited using chemical vapor deposition (CVD).

The electrically conductive material that is deposited in the second trench 65 typically provides interconnect structures in the second level 55 of the electrical device. The electrically conductive material that is deposited in the first trench 60 that fills the metal line portion 35a, the via portions 36a, 36b and the air gap for housing the fuse link 45 in the first level 50 provides both interconnect structures and a fuse. The fuse includes electrical contact regions 40a, 40b provided by the electrically conductive material deposited in the via portions 36a, 36b and a fuse link 45 provided by the electrically conductive material that is deposited in the air gap.

In some embodiments, the methods and structures provide a back end of the line (BEOL) vertical fuse formed using an air gap structure. In some embodiments, the methods and structures disclosed herein provide that a prior level air gap structure be merged with a subsequently formed line and/or via structure to provide a vertical fuse. The methods and structures disclosed herein may provide that selective application of high current can be used to trigger a fuse.

Having described preferred embodiments of systems, apparatuses and devices including an electrical fuse (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
a first level comprised of an array of metal lines, wherein a plurality of air gaps are present separating adjacent metal layers in the array of metal lines; and
a second level including a plurality of trenches in an interlevel dielectric layer that contain electrically conductive material, wherein a first set of the plurality of trenches including said electrically conductive material extends into at least one of the air gaps to provide a vertical fuse.

2. The electrical device of claim 1, wherein the first set of the plurality of trenches includes a line portion having a first depth and a via portion having a second depth, the second depth being greater than the first depth and extending to the air gaps.

3. The electrical device of claim 2, wherein the via portions provide a first contact region and a second contract region to the vertical fuse, and the electrically conductive material in the air gaps provides a fuse link.

4. The electrical device of claim 2, wherein at least one interface between the via portions that provide the first contact region and the second contact region and the electrically conductive material in the air gap that provides the fuse link has a necked opening with a width that is less than half the dimension separating adjacent metal lines in the array of metal lines.

5. The electrical device of claim 4, wherein said with of the necked region ranges from 5 nm to 40 nm.

6. The electrical device of claim 3, wherein the fuse link is entirely present in the first level.

7. The electrical device of claim 3, wherein the fuse link is blown by currents ranging from 10 mA to 15 mA.

8. An electrical device comprising:
a first level comprised of an array of metal lines, wherein a plurality of air gaps are present separating adjacent metal layers in the array of metal lines; and
a second level including a plurality of trenches in an interlevel dielectric layer that contain electrically conductive material, wherein a first set of the plurality of trenches including said electrically conductive material extends into at least one of the air gaps to provide a fuse link of a fuse structure, wherein the fuse link is entirely present in the first level.

9. The electrical device of claim 8, wherein the first set of the plurality of trenches includes a line portion having a first depth and a via portion having a second depth, the second depth being greater than the first depth and extending to the air gaps.

10. The electrical device of claim 9, wherein the via portions provide a first contact region and a second contract region to the vertical fuse, and the electrically conductive material in the air gaps provides a fuse link.

11. The electrical device of claim 8, wherein at least one interface between the via portions that provide the first contact region and the second contact region and the electrically conductive material in the air gap that provides the fuse link has a necked opening with a width that is less than half the dimension separating adjacent metal lines in the array of metal lines.

12. The electrical device of claim 8, wherein said with of the necked region ranges from 5 nm to 40 nm.

13. The electrical device of claim 8, wherein the vertical fuse is blown by currents ranging from 10 mA to 15 mA.

14. An electrical device comprising:
a first level comprised of an array of metal lines, wherein a plurality of air gaps are present separating adjacent metal layers in the array of metal lines; and
a second level including a plurality of trenches in an interlevel dielectric layer that contain electrically conductive material, wherein a first set of the plurality of trenches including said electrically conductive material extends into at least one of the air gaps to provide a fuse link of a fuse structure, wherein the fuse link is entirely present in the first level and includes a necked region at an upper surface of the fuse link.

15. The electrical device of claim 14, wherein the first set of the plurality of trenches includes a line portion having a first depth and a via portion having a second depth, the second depth being greater than the first depth and extending to the air gaps.

16. The electrical device of claim 15, wherein the via portions provide a first contact region and a second contract region to the vertical fuse, and the electrically conductive material in the air gaps provides a fuse link.

17. The electrical device of claim 14, wherein at least one interface between the via portions that provide the first contact region and the second contact region and the electrically conductive material in the air gap that provides the fuse link has a necked opening with a width that is less than half the dimension separating adjacent metal lines in the array of metal lines.

18. The electrical device of claim 14, wherein said with of the necked region ranges from 5 nm to 40 nm.

19. The electrical device of claim 14, wherein the vertical fuse is blown by currents ranging from 10 mA to 15 mA.

20. The electrical device of claim 14, wherein a width of the fuse line is greater than a width of the necked region.

* * * * *